US011940608B2

(12) United States Patent
Goorden

(10) Patent No.: US 11,940,608 B2
(45) Date of Patent: Mar. 26, 2024

(54) DARK FIELD MICROSCOPE

(71) Applicant: ASML NETHERLANDS B.V., Veldhoven (NL)

(72) Inventor: Sebastianus Adrianus Goorden, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 368 days.

(21) Appl. No.: 17/608,038

(22) PCT Filed: Apr. 2, 2020

(86) PCT No.: PCT/EP2020/059473
§ 371 (c)(1),
(2) Date: Nov. 1, 2021

(87) PCT Pub. No.: WO2020/224882
PCT Pub. Date: Nov. 12, 2020

(65) Prior Publication Data
US 2022/0229278 A1    Jul. 21, 2022

(30) Foreign Application Priority Data

May 6, 2019  (EP) .................................. 19172766

(51) Int. Cl.
*G02B 21/00*     (2006.01)
*G01N 21/95*     (2006.01)
(Continued)

(52) U.S. Cl.
CPC ..... *G02B 21/0016* (2013.01); *G01N 21/9501* (2013.01); *G02B 21/002* (2013.01);
(Continued)

(58) Field of Classification Search
CPC .............. G02B 21/0016; G02B 21/002; G02B 21/0024; G02B 21/0028; G02B 21/0032;
(Continued)

(56) References Cited

U.S. PATENT DOCUMENTS 6,961,116 B2   11/2005  Den Boef et al.
7,295,303 B1 *  11/2007  Vaez-Iravani ......... G02B 21/06
                                                        356/237.4
(Continued)

FOREIGN PATENT DOCUMENTS

JP    H02028311    1/1990
JP    2001194323   7/2001
(Continued)

OTHER PUBLICATIONS

Office Action dated Nov. 24, 2022, issued in corresponding Japanese Patent Application No. 2021-560362, pp. 1-9.

*Primary Examiner* — Gordon J Stock, Jr.
(74) *Attorney, Agent, or Firm* — Pillsbury Winthrop Shaw Pittman, LLP

(57) ABSTRACT

A dark field metrology device includes an objective lens arrangement and a zeroth order block to block zeroth order radiation. The objective lens arrangement directs illumination onto a specimen to be measured and collects scattered radiation from the specimen, the scattered radiation including zeroth order radiation and higher order diffracted radiation. The dark field metrology device is operable to perform an illumination scan to scan illumination over at least two different subsets of the maximum range of illumination angles; and simultaneously perform a detection scan which scans the zeroth order block and/or the scattered radiation with respect to each other over a corresponding subset of the maximum range of detection angles during at least part of the illumination scan.

20 Claims, 12 Drawing Sheets

(51) Int. Cl.
  *G01N 21/956* (2006.01)
  *G02B 21/02* (2006.01)
  *G02B 21/10* (2006.01)
  *G03F 7/00* (2006.01)
(52) U.S. Cl.
  CPC ......... *G02B 21/0036* (2013.01); *G02B 21/02* (2013.01); *G02B 21/10* (2013.01); *G03F 7/70625* (2013.01); *G03F 7/70633* (2013.01); *G03F 7/706849* (2023.05); *G03F 7/706851* (2023.05); *G01N 21/95623* (2013.01)
(58) Field of Classification Search
  CPC .. G02B 21/0036; G02B 21/02; G02B 21/084; G02B 21/10; G02B 21/12; G02B 21/125; G02B 21/361; G01N 21/9501; G01N 21/956; G01N 21/95607; G01N 21/95623; G01N 21/9563; G03F 7/70605; G03F 7/70608; G03F 7/70616; G03F 7/70625; G03F 7/70633; G03F 7/70641; G03F 7/7065; G03F 7/70653; G03F 7/70681; G03F 7/706843; G03F 7/706845; G03F 7/706849; G03F 7/706851
  See application file for complete search history.

(56) References Cited

U.S. PATENT DOCUMENTS

| | | | |
|---|---|---|---|
| 7,345,754 B1* | 3/2008 | Zhao | G03F 7/7065 |
| | | | 359/559 |
| 8,614,790 B2* | 12/2013 | Berlatzky | G01N 21/956 |
| | | | 356/310 |
| 9,081,303 B2* | 7/2015 | Cramer | G03F 7/70625 |
| 9,709,510 B2* | 7/2017 | Kolchin | G01N 21/956 |
| 9,904,181 B2 | 2/2018 | Quintanilha | |
| 9,946,167 B2 | 4/2018 | Smilde et al. | |
| 10,072,921 B2* | 9/2018 | Fu | G03F 7/00 |
| 10,101,676 B2* | 10/2018 | Fu | G03F 9/7046 |
| 10,222,517 B2* | 3/2019 | Gilad | G01N 21/9501 |
| 11,428,642 B2* | 8/2022 | Hill | G03F 7/70633 |
| 2006/0007436 A1 | 1/2006 | Kurosawa et al. | |
| 2006/0033921 A1 | 2/2006 | Den Boef et al. | |
| 2006/0066855 A1 | 3/2006 | Den Boef et al. | |
| 2006/0262297 A1 | 11/2006 | Matsui et al. | |
| 2009/0195768 A1 | 8/2009 | Bijnen et al. | |
| 2010/0201963 A1 | 8/2010 | Cramer et al. | |
| 2011/0027704 A1 | 2/2011 | Cramer et al. | |
| 2011/0043791 A1 | 2/2011 | Smilde et al. | |
| 2011/0102753 A1 | 5/2011 | Van De Kerkhof et al. | |
| 2012/0044470 A1 | 2/2012 | Smilde et al. | |
| 2012/0123581 A1 | 5/2012 | Smilde et al. | |
| 2013/0258310 A1 | 10/2013 | Smilde et al. | |
| 2013/0271740 A1 | 10/2013 | Quintanilha | |
| 2014/0375981 A1 | 12/2014 | Wang et al. | |
| 2015/0042999 A1 | 2/2015 | Quintanilha | |
| 2015/0355554 A1 | 12/2015 | Mathijssen | |
| 2016/0366315 A1* | 12/2016 | Gilad | G02B 13/0055 |
| 2017/0292918 A1 | 10/2017 | Kolchin et al. | |

FOREIGN PATENT DOCUMENTS

| | | |
|---|---|---|
| JP | 2014502420 | 1/2014 |
| JP | 2016523387 | 8/2016 |
| JP | 2017527780 | 9/2017 |
| WO | 2009078708 | 6/2009 |
| WO | 2009106279 | 9/2009 |
| WO | 2013178422 | 12/2013 |
| WO | 2015051970 | 4/2015 |
| WO | 2015000673 | 8/2015 |
| WO | 2017186483 | 11/2017 |
| WO | 2020057900 | 3/2020 |

* cited by examiner (a)

(b)

DARK FIELD MICROSCOPE

CROSS-REFERENCE TO RELATED APPLICATION

The application is the U.S. national phase entry of PCT Patent Application No. PCT/EP2020/059473 which was filed on Apr. 2, 2020, which is based upon and claims the benefit of priority of European Patent Application No. 19172766.8 which was filed on May 6, 2019, each of which is incorporated herein in its entirety by reference.

FIELD OF THE INVENTION

The present invention relates to an apparatus for dark field microscopy.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer. A type of sensor widely used in current lithographic apparatus is based on a self-referencing interferometer as described in U.S. Pat. No. 6,961,116 (den Boef et al). Generally marks are measured separately to obtain X- and Y-positions. However, combined X- and Y-measurement can be performed using the techniques described in published patent application US 2009/195768 A (Bijnen et al). Modifications and applications of such sensors are described in US2015355554A1 (Mathijssen), WO2015051970A1 (Tinnemans et al). The contents of all of these publications are incorporated herein by reference.

In order to monitor the lithographic process, parameters of the patterned substrate are measured. Parameters may include, for example, the overlay error between successive layers formed in or on the patterned substrate. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

Dark field microscopes, such as the metrology device mentioned above, and more generally, have the problem of having the range of acceptance angles for illumination and detection limited, as it is required that the total range of acceptance angles (corresponding to regions within the angle resolved pupil) are shared between the illumination path and detection path. This limits the effective NA in illumination and detection.

It would be desirable to increase the effective NA in illumination and detection.

SUMMARY OF THE INVENTION

In a first aspect of the invention, there is provided a dark field metrology device comprising: an objective lens arrangement operable to direct illumination onto a specimen to be measured and to collect scattered radiation from said specimen, said scattered radiation comprising zeroth order radiation and higher order diffracted radiation, wherein said objective lens arrangement defines a maximum range of illumination angles for accepting said illumination in a illumination path and a maximum range of detection angles for accepting the scattered radiation in a detection path; and a zeroth order block operable to block said zeroth order radiation; wherein said dark field metrology device is operable to perform an illumination scan to scan said illumination over at least two different subsets of said maximum range of illumination angles; and simultaneously perform a detection scan which scans one of both of the zeroth order block and the scattered radiation with respect to each other over a corresponding subset of said maximum range of detection angles during at least part of said illumination.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
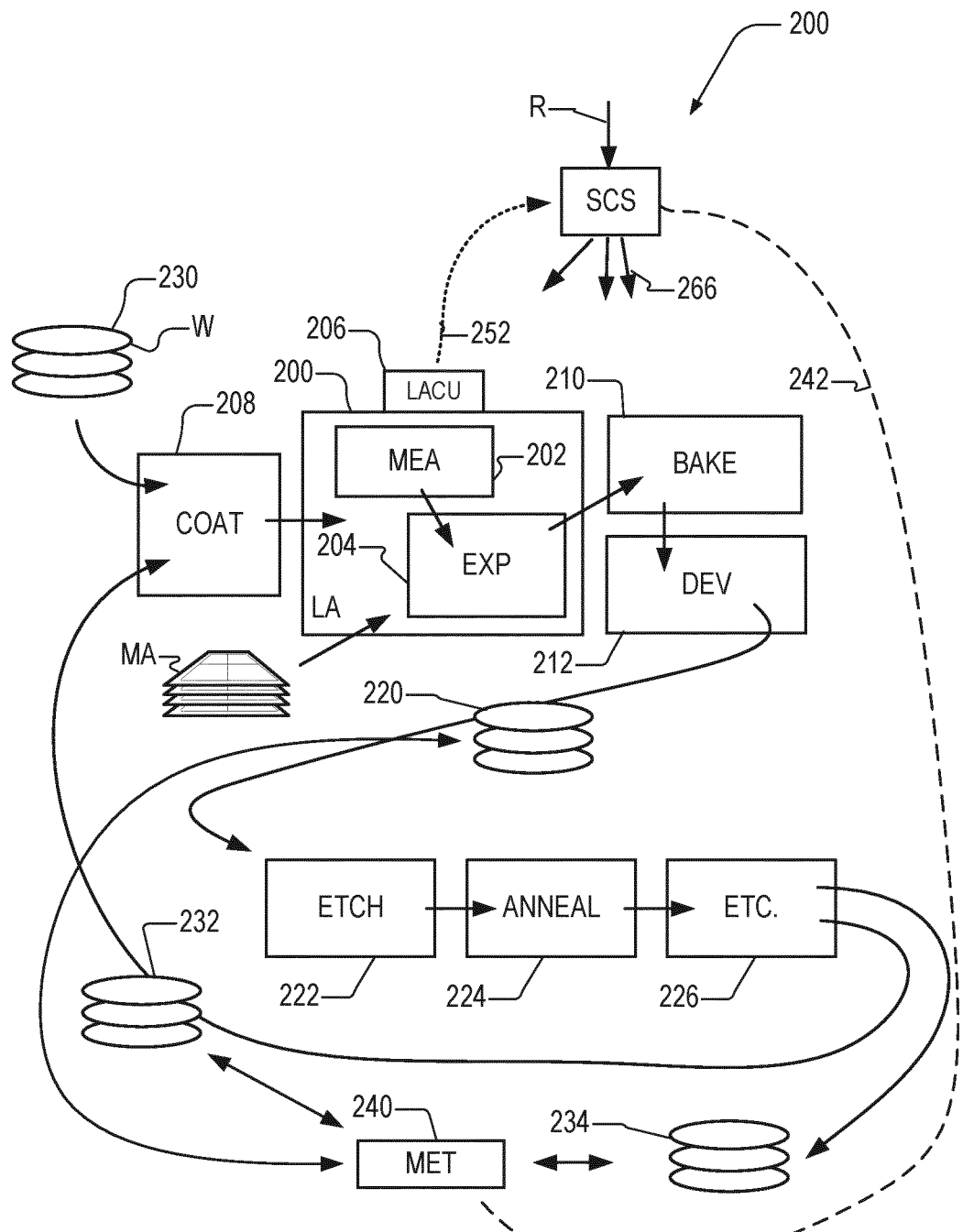
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a sub-system or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

Figure 2:
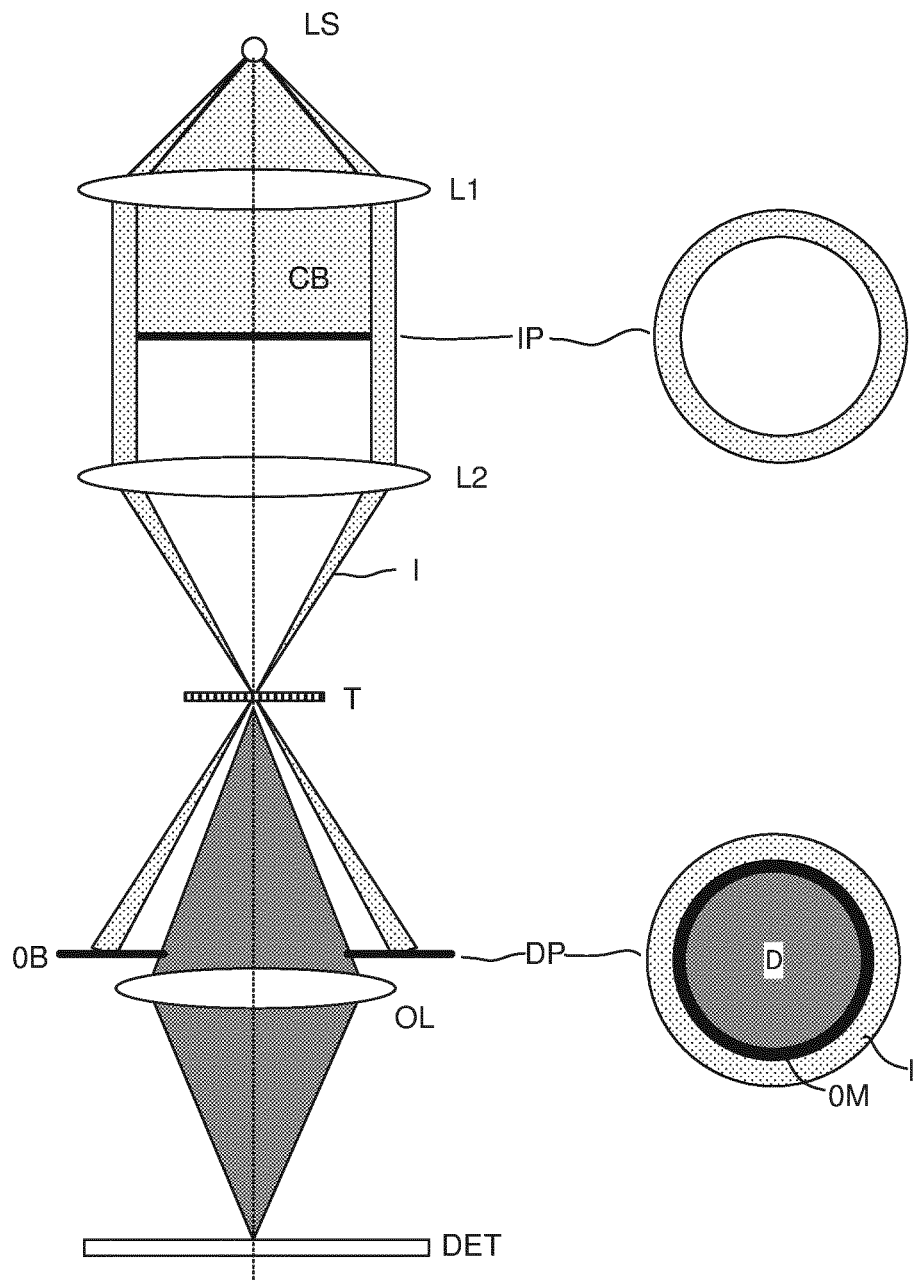
FIG. 2 comprises a schematic diagram of a dark field scatterometer for use in measuring targets.

FIG. 2 shows a simple dark field microscope or metrology device arrangement. In a dark field metrology apparatus, the zeroth order radiation is blocked from the detection optics, such that the captured dark field image comprises only higher order diffracted radiation (ignoring stray light). This is achieved by separating the pupil (Fourier plane) into a range of illumination angles (at which zeroth order will be admitted to the target) and a range of allowed detection angles (where the higher order scattered light is expected to go). This effectively divides the pupil into a mutually exclusive illumination region (which may comprise multiple isolated regions) and a detection region (which may also comprise multiple isolated regions), hereafter referred to as the illumination pupil and detection pupil respectively.

In FIG. 2, a light source LS provides radiation, which is collected by a lens system L1, L2. At the illumination pupil IP, a block defines the illumination shape; in this example the central beam CB is blocked to define an annular illumination profile in the illumination pupil IP. The illumination is focussed by lens L2 onto a specimen T to be measured. Light diffracted by specimen T is collected and focussed by objective lens OL onto detector DET. A zeroth order block 0B blocks the zeroth order radiation from the specimen T. The resultant detection pupil DP shows the area D available for the diffracted illumination (which defines the detection NA). It also shows the area which is therefore unavailable for detection, having been used for the illumination I and additionally a suitable zeroth order block margin 0M, which limits suppression of light scattered around the zeroth order.

FIG. 3(a) shows an exemplary dark field metrology apparatus of a type specifically adapted for lithographic process metrology applications. An alternative metrology apparatus may use EUV radiation such as, for example, that disclosed in WO2017/186483A1. A target structure T and diffracted rays of measurement radiation used to illuminate the target structure are illustrated in more detail in FIG. 3(b). The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. Other modes of illumination are possible by using different apertures. The rest of the pupil plane is desirably dark as any unnecessary light outside the desired illumination mode will interfere with the desired measurement signals.

Figure 3:
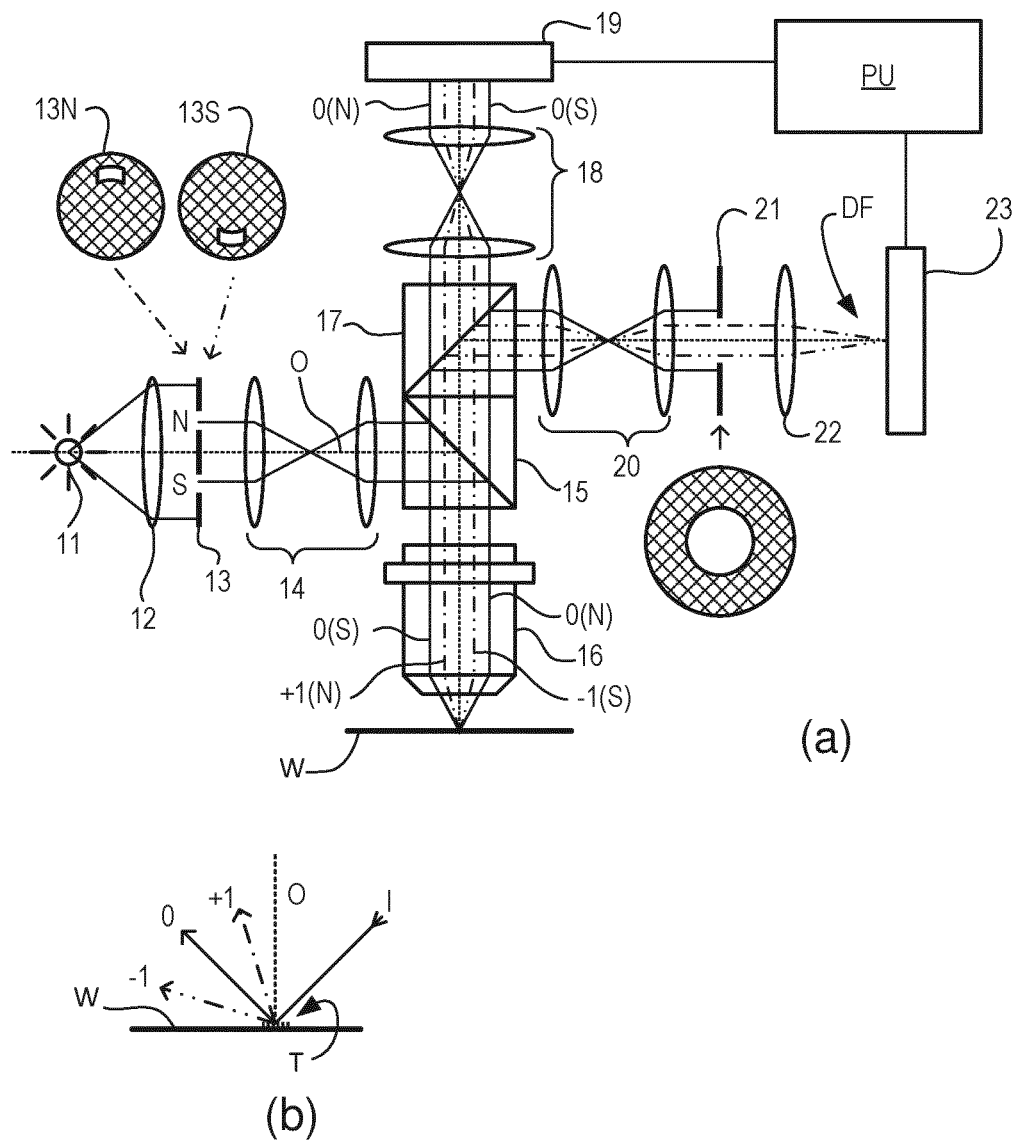
FIG. 3 is a schematic illustration of a metrology device to which the inventive concept is applicable

As shown in FIG. 3(b), target structure T is placed with substrate W normal to the optical axis O of objective lens 16. The substrate W may be supported by a support (not shown). A ray of measurement radiation I impinging on target structure T from an angle off the axis O gives rise to a zeroth order ray (solid line 0) and two first order rays (dot-chain line +1 and double dot-chain line −1). It should be remembered that with an overfilled small target structure, these rays are just one of many parallel rays covering the area of the substrate including metrology target structure T and other features. Since the aperture in plate 13 has a finite width (necessary to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the target structures and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram. The particular forms of aperture plate 13 and field stop 21 shown in FIG. 3 are purely examples.

At least the 0 and +1 orders diffracted by the target structure T on substrate W are collected by objective lens 16 and directed back through beam splitter 15. A second beam splitter 17 divides the diffracted beams into two measurement branches. In a first measurement branch, optical system 18 forms a diffraction spectrum (pupil plane image) of the target structure on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target structure T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

A consequence of dividing the pupil into mutually exclusive illumination and detection pupils is that there is a necessary reduction in the illumination NA and in the detection NA. While there is some flexibility in trade-off between the illumination NA and detection NA, ultimately having both NAs desirably large is not possible within a single pupil. Referring back to FIG. 2, the illumination NA (defined by the range of angles, i.e., the annulus width) is in the region of only 0.1. The zeroth order block margin also comprises an NA of about 0.1, limiting the detection NA to about 0.6.

A dark field microscope or metrology device will be described which will provide for an increased illumination NA and detection NA compared to what is presently achievable. The concept described herein is applicable to any dark field microscope or metrology device, whether used in lithography applications or otherwise. In the context of lithography applications, the concepts are equally applicable to dark field alignment sensor devices and post-exposure dark field metrology devices (such as illustrated in FIG. 3).

The concept comprises, during a measurement, moving the illumination between at least two different locations in the illumination pupil, while simultaneously effectively moving the detection aperture. The effective movement of the detection aperture may be achieved by moving the zeroth order block with respect to the diffracted/reflected radiation in the pupil, so as to block the zeroth order radiation for each location of said illumination. Moving the zeroth order block with respect to the diffracted/reflected radiation in the detection pupil may comprise physically moving the zeroth order block or leaving the zeroth order block fixed and physically moving/directing the diffracted/reflected radiation in the pupil (or a combination of both). Any mention below of moving the zeroth order block can be understood to encompass the situation where the zeroth order block is physically fixed and the diffracted/reflected beam directed in correspondence with the illumination.

More specifically, the metrology device comprises an objective lens arrangement operable to direct illumination onto a specimen to be measured and to collect scattered radiation from said specimen, said scattered radiation comprising zeroth order radiation and higher order diffracted radiation, wherein said objective lens arrangement defines a maximum range of illumination angles for accepting said illumination in a illumination path and a maximum range of detection angles for accepting the scattered radiation in a detection path; and a zeroth order block operable to block said zeroth order radiation; The dark field metrology device is operable to perform an illumination scan to scan said illumination over at least two different subsets of said maximum range of illumination angles; and simultaneously perform a detection scan which scans one of both of the zeroth order block and the scattered radiation with respect to each other over a corresponding subset of said maximum range of detection angles during at least part of said scan of said illumination.

In an embodiment, the illumination will be moved over more than two locations, with the zeroth order block being positioned such that it always blocks the zeroth order radiation. In this case, the zeroth order may be moved in correspondence with the illumination for all locations, or alternatively, only when necessary to block the zeroth order (e.g., in the latter case, a central area can be scanned without moving the zeroth order in a first stage and a peripheral area scanned simultaneously with the zeroth order block in a second stage). In an embodiment, the number of locations covered by the scan may be dependent on the spatial coherence of the radiation source and spatial modes available and/or to be addressed at wafer level, for example they should be approximately equal (e.g., within 20% or within 10%).

Figure 4:
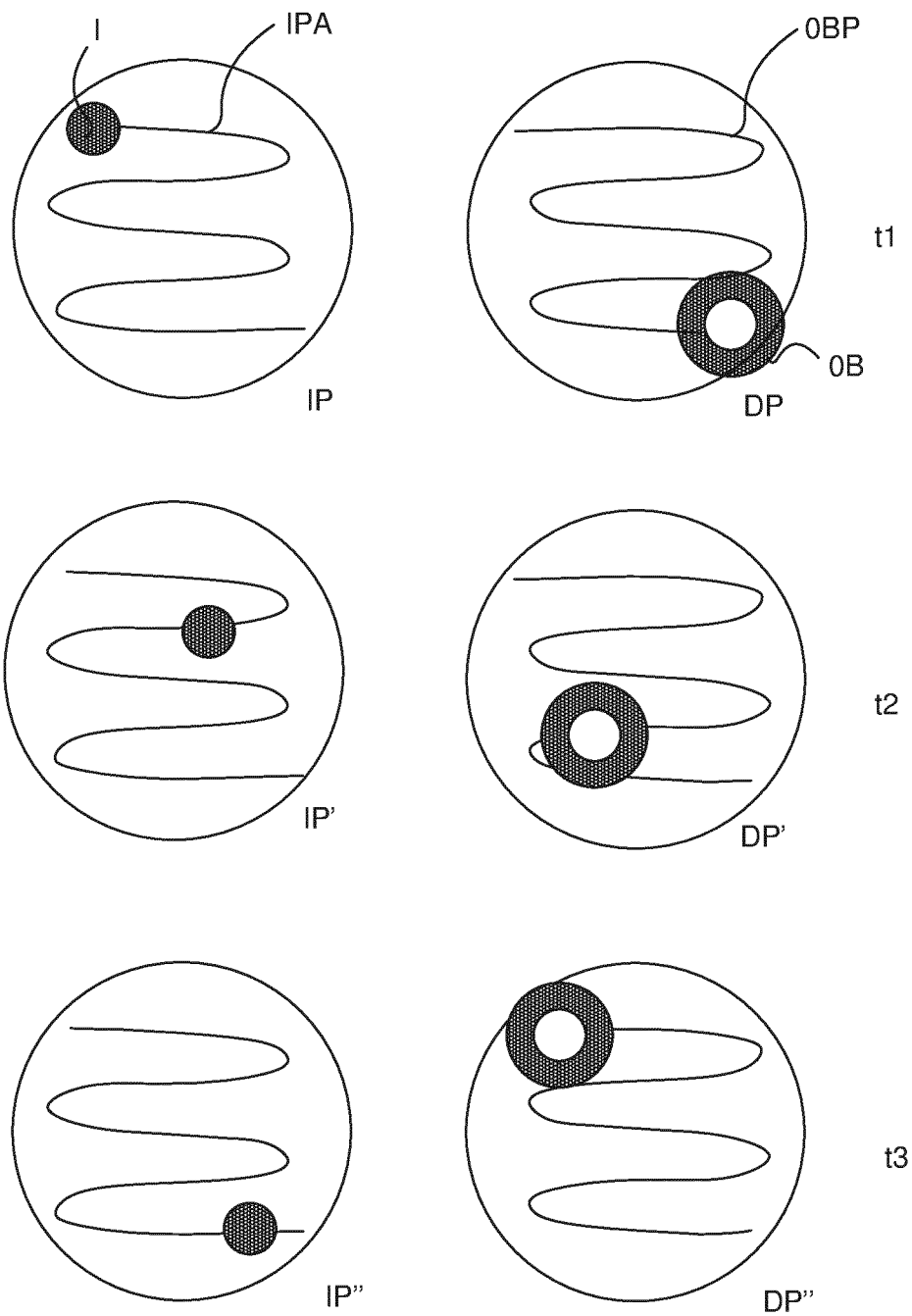
FIG. 4 is a pupil representation at three time instances illustrating the inventive concept.

FIG. 4 illustrates the basic principle. It shows an illumination pupil IP, IP', IP'' and detection pupil DP, DP', DP'', at three different time instances t1, t2, t3 during a scan. Each pupil is an angularly resolved spectrum of intensities. More specifically, the extent of each outer circle corresponds to, respectively the maximum illumination NA (maximum NA in illumination direction), and represents the maximum range of illumination angles for accepting said illumination, and maximum detection NA (maximum NA in detection direction) of the microscope objective, which represents the maximum range of detection angles for detecting scattered radiation in the detection path. In both cases, the maximum NA may be, purely by way of an example 0.95 NA. The detection pupil DP, DP', DP'' is defined by a zeroth order block 0B. The illumination path IPA and zeroth order block path 0BP are shown as corresponding meandering lines. At each time instance, the zeroth order block 0B is located to block the zeroth order in dependence of the location of the illumination pupil IP, IP', IP''. As such, the zeroth order block is scanned along a path corresponding to that followed by the illumination I, at the same speed but in the opposite direction.

The meandering path shown is purely illustrative to describe the basic concept. If a meandering path was used, it may be that the passes are more tightly bunched such that a greater area (greater range of acceptance angles) within the pupil is covered. It may be preferred that each location is scanned for equal duration, such that each spatial mode is addressed equally. Therefore a spiral path may be preferred, to prevent dwelling at meander end points. The scan may be continuous, or discrete movements of the illumination (and corresponding movements of the zeroth order block) may be made. It can be appreciated that it is possible to scan the illumination and zeroth order block in this manner over the whole available objective lens NA, for both illumination and detection. As such, the arrangement enables each of the illumination NA and detection NA of a dark field microscope to be in the region of 0.95. At the same time, the zeroth order block margin can be increased to 0.2-0.3NA, while also being very flexible.

It has been mentioned that the number of scanning locations can be dependent on the illumination characteristics, and in particular on the spatial coherence of the radiation. In particular, embodiments may include:

1) Using a spatially coherent light source and scanning over large number of positions (e.g., for example between 100 and 1000, or between 100 and 10000 positions). For example, the number of scanned positions may be equal to (or in the region of) the total number of spatial modes available and/or to be addressed at wafer level.
2) Using a spatially incoherent light source (with e.g., M spatial modes) and scanning over fewer scan positions (e.g. K positions), where M*K should typically be approximately equal to the etendue (i.e., the total number of spatial modes) available and/or to be addressed at wafer level (e.g., within 20% or within 10%).
3) Using a spatially coherent light source and two-stage scanning. The first stage scanning scans the light source over e.g. M spatial modes within a first region while the zeroth order block is at a fixed position (with respect to the diffracted/reflected beam). This is approximately equivalent to a single scan position in embodiment 2) directly above. The second stage scan then scans the illumination and zeroth order block together over e.g., K scan positions in the pupil (e.g., to cover the remainder of the area to be scanned).

The advantage of embodiment 3) is that it provides the combination of having a bright light source and of averaging out clipping at the edges of the zeroth order block (as well as the advantages of averaging out sensor imperfections, angle-dependent mark effects and clipping at the edge of the objective pupil which are applicable to all embodiments).

It is proposed that, typically, one camera image (e.g., 1 ms to 100 ms integration time) can be captured which comprises integration of all scan positions. In principle, it is also possible to take separate images at each scan position with a high-speed camera, and then post-process the data (e.g., do something more advanced than integrating/averaging the images).

A challenge in many microscopes and sensors is that both a high brightness light source and spatially incoherent illumination are desired at the same time. Although it is not the main advantage of the proposed system, it does effectively offer both of these advantages for free.

Figure 5:
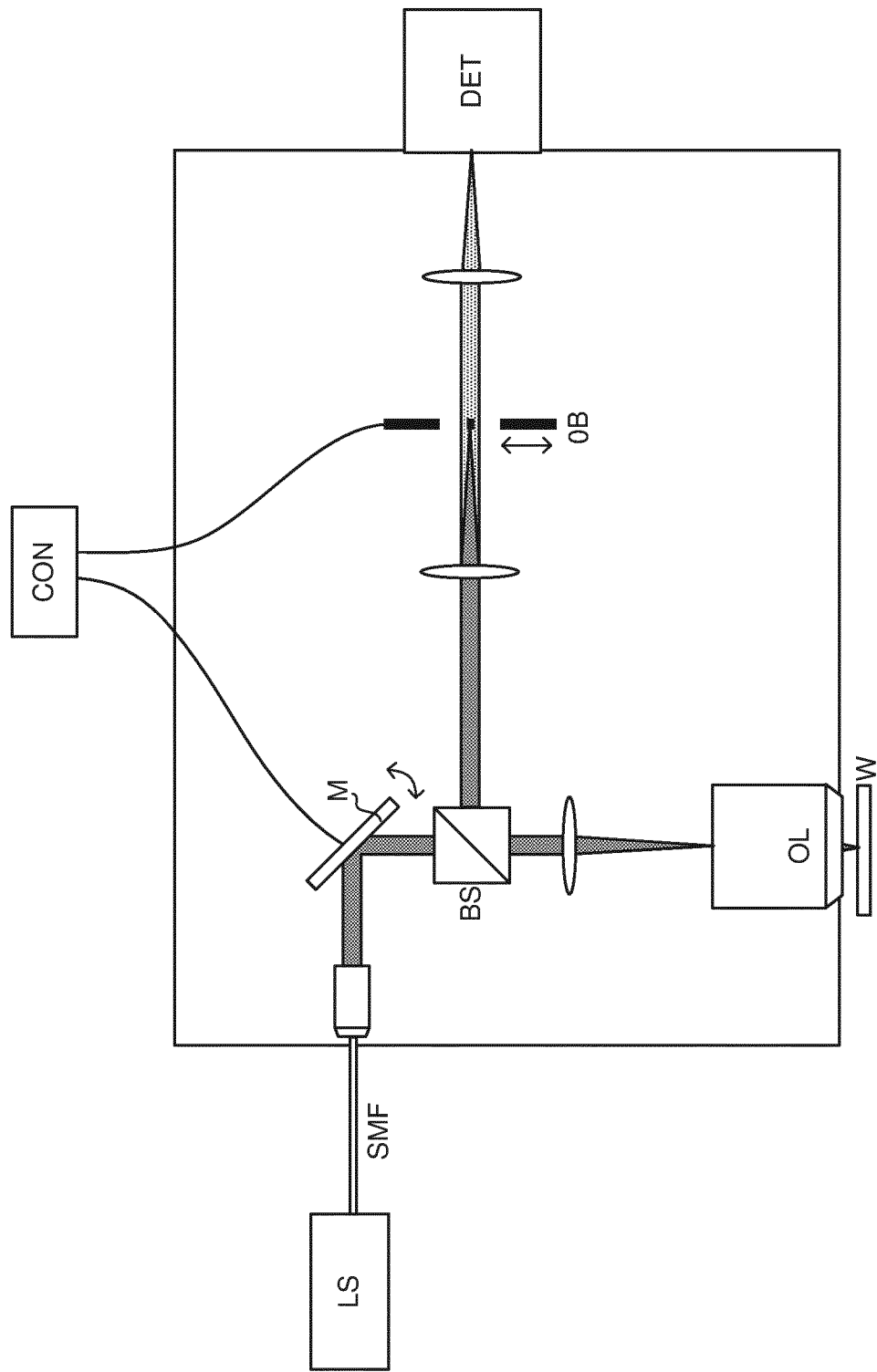
FIG. 5 is a schematic illustration of a metrology device according to a first embodiment of the invention.

FIG. 5 is a schematic illustration of a possible dark field microscope arrangement incorporating the proposed principles. It shows a laser light source LS, the output of which is coupled to the system (i.e., inside the optical module) via a suitable method (e.g., a single mode fiber SMF for a coherent radiation embodiment). The resultant radiation is directed via a configurable optical device M (e.g., tiltable/scan mirror, digital micromirror device or equivalent), through beamsplitter BS to the objective lens OL and onto the sample (e.g., a target on a substrate W). The scattered (e.g., diffracted and reflected radiation comprising the zeroth order and +1 and/or −1 diffraction orders) are directed by beamsplitter BS to the detection branch. The zeroth order block OB blocks the zeroth order (reflected) radiation, while the higher order radiation is imaged onto detector DET. A controller CON controls the optical device M and zeroth order block OB simultaneously as described (move the illumination within the available pupil while moving the zeroth order block OB to ensure the zeroth order is always blocked).

Figure 6:
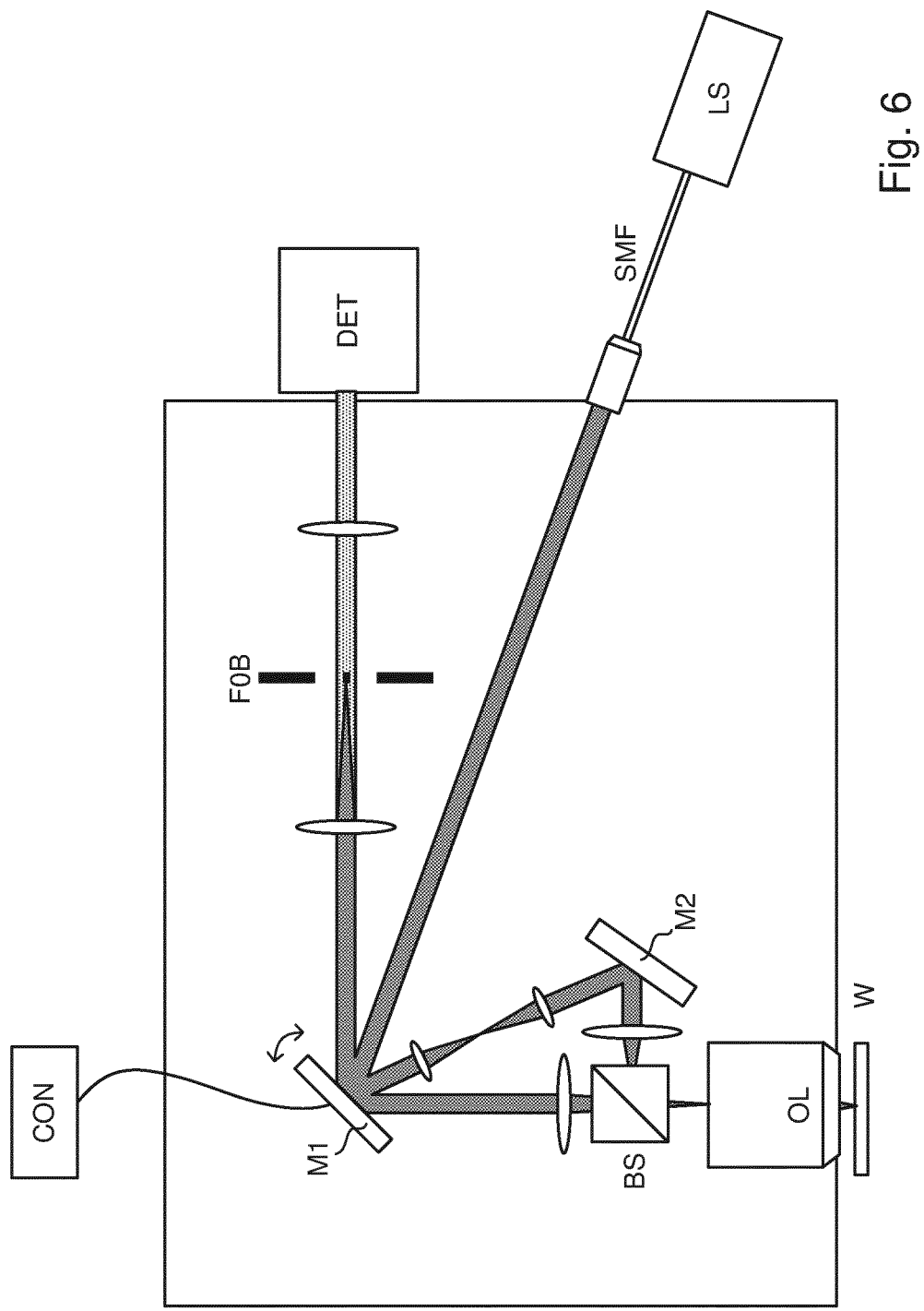
FIG. 6 is a schematic illustration of a metrology device according to a second embodiment of the invention.

FIG. 6 is a schematic illustration of an alternative dark field microscope arrangement which obviates the problem of synchronizing the control of optical device M and zeroth order block OB, which can be difficult to do sufficiently accurately. Where elements are the same as in FIG. 5, they will not be described again.

The main difference in this embodiment is that the zeroth order block F0B is fixed in position and only the optical device M1 is controlled by controller CON. However, the beam directioning within the device is such that the same optical device M simultaneously directs the illumination radiation over a range of acceptance angles, and the scattered radiation with respect to the fixed zeroth order block F0B within the detection pupil, such that the zeroth order is blocked throughout the illumination scan. The arrangement as shown can be such that the resultant control of the illumination and control of the relative position of scattered radiation and zeroth order block can be performed essentially identically to that shown in FIG. 4, or in identical fashion to any simultaneous control with the arrangement of FIG. 5. The specific arrangement shown for achieving this is purely exemplary (e.g., using beamsplitter BS and mirror M2), and the skilled person will recognize that there are many different arrangements and configurations which would work in a similar fashion.

In the above examples, the physical scanning is effected using a configurable optical device M, such as a tiltable/scan mirror, digital micromirror device or equivalent. However, the scanning of the illumination beam inside the optical module may cause instabilities. Therefore, in another embodiment, the scanning through different subsets of illumination angles (scanning within the pupil) may be performed using a fiber bundle (possible in combination with a lens array). In such an embodiment, the fiber bundle selectively transports the illumination radiation from the illumination source outside of the optical module, to the illumination optics. The scanning is achieved by selecting which subset of fibers of the fiber bundle is active (transporting the illumination radiation) at any one time. For example, the arrangement may perform an illumination scan by sequentially sending light through each of the fibers in the bundle individually (or, more generally through different subsets of fibers individually). The light may be sent thorough different fibers by a scanning mirror at the fiber bundle input, for example, or by any other means as will be apparent to the skilled person. As such, any method of scanning the illumination within the illumination pupil (through different subsets of illumination angles) can be used, regardless of whether the physical scanning is done in a Fourier plane or an image plane.

A specific dark field metrology device with optimized coherence for which the proposed concept is also applicable, will now be briefly described. Such a device is disclosed and more comprehensively described in European applications EP18195488.4 and EP19150245.9, which are incorporated herein by reference.

The metrology device is configured to produce a plurality of spatially incoherent beams of measurement illumination, each of said beams (or both beams of measurement pairs of said beams, each measurement pair corresponding to a measurement direction) having corresponding regions within their cross-section for which the phase relationship between the beams at these regions is known; i.e., there is mutual spatial coherence for the corresponding regions. Such a metrology device is able to measure small pitch targets with acceptable (minimal) interference artifacts (speckle) in a dark field mode. Such a metrology device may be used as a position or alignment sensor for measuring substrate position or other post-exposure parameter such as overlay or focus.

Figure 7:
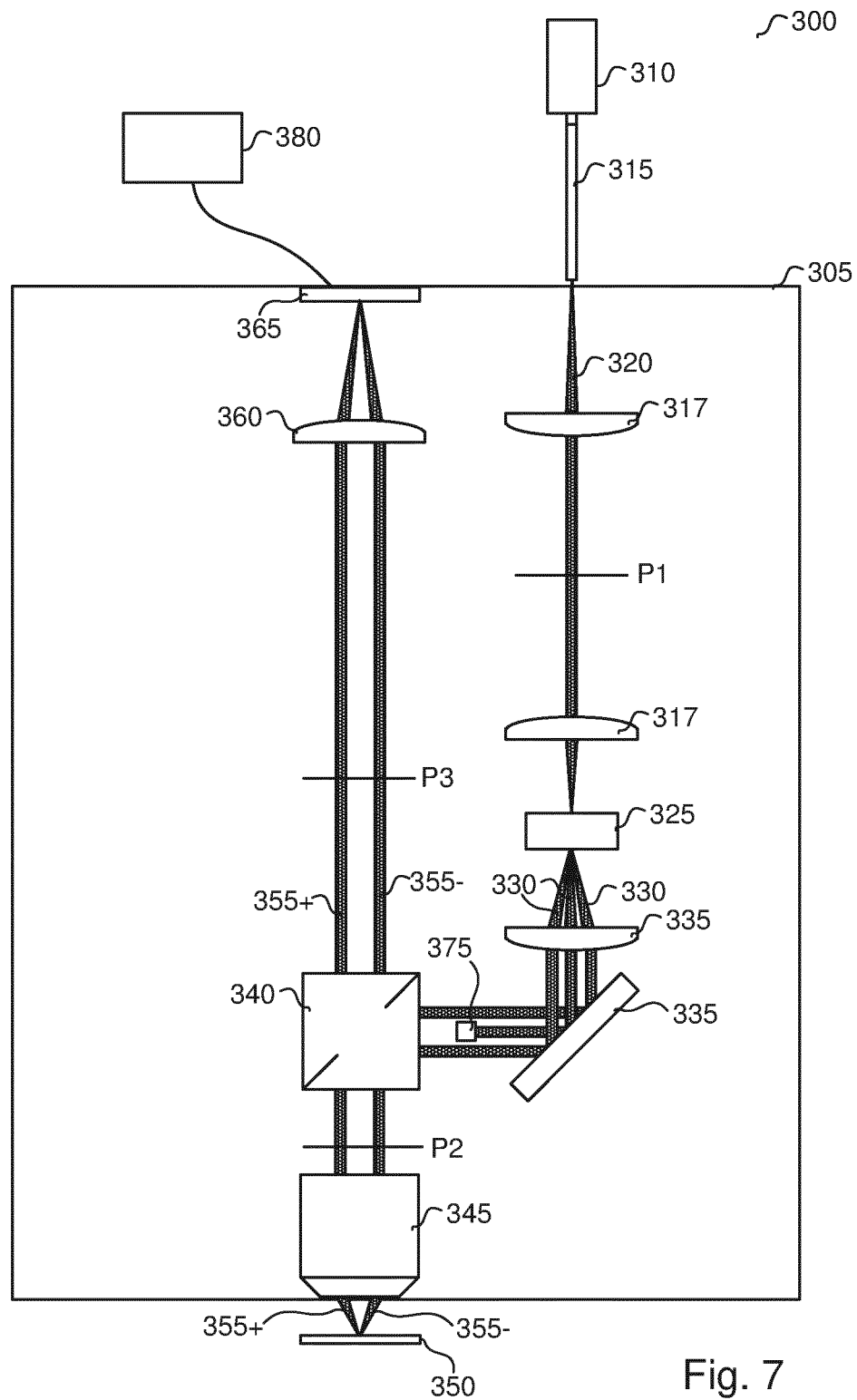
FIG. 7 is a schematic illustration of a metrology device to which the inventive concept is applicable.

FIG. 7 shows a possible implementation of such a metrology device. The metrology device essentially operates as a standard microscope with a novel illumination mode. The metrology device 300 comprises an optical module 305 comprising the main components of the device. An illumination source 310 (which may be located outside the module 305 and optically coupled thereto by a multimode fiber 315) provides a spatially incoherent radiation beam 320 to the optical module 305. Optical components 317 deliver the spatially incoherent radiation beam 320 to a coherent off-axis illumination generator 325. The coherent off-axis illumination generator 325 generates a plurality (e.g., four) off-axis beams 330 from the spatially incoherent radiation beam 320. The coherent off-axis illumination generator 325 may comprise a phase grating for example. The characteristics of these off-axis beams 330 will be described in detail further below. Where necessary (e.g., when the coherent off-axis illumination generator 325 comprises a phase grating), the zeroth order of the illumination generator may be blocked by an illumination zeroth order block element 375.

The off-axis beams 330 are delivered (via optical components 335) and a spot mirror 340 to an (e.g., high NA) objective lens 345. The objective lens focusses the off-axis beams 330 onto a sample (e.g., periodic structure/alignment mark) located on a substrate 350, where they scatter and diffract. The scattered higher diffraction orders 355+, 355− (e.g., +1 and −1 orders respectively), propagate back via the spot mirror 340, and are focused by optical component 360 onto a sensor or camera 365 where they interfere to form an interference pattern. A processor 380 running suitable software can then process the image(s) of the interference pattern captured by detector or camera 365. From the position of fringes in the interference pattern (e.g., with respect to a fixed reference) positional information can be determined. As such the metrology sensor can be used as an alignment sensor for performing alignment (e.g., of a substrate and/or reticle stage) in a lithographic manufacturing process or other metrology process.

Figure 9:
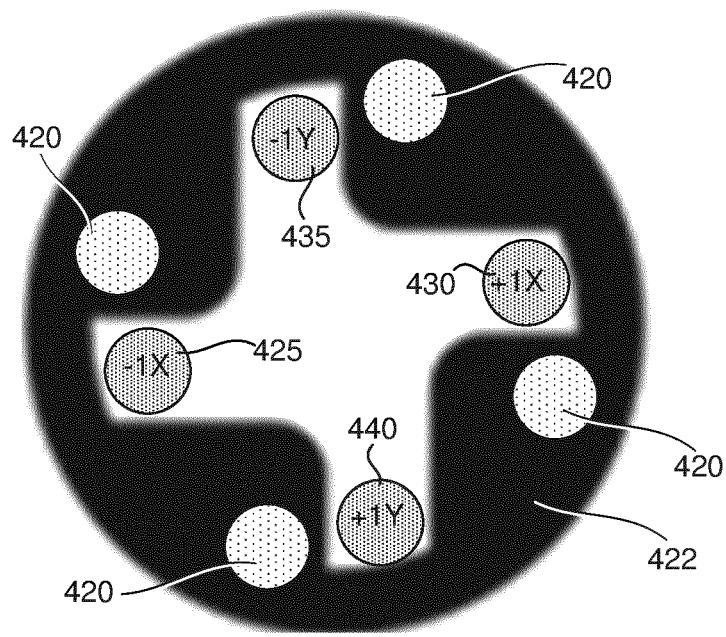
FIG. 9 illustrates (a) a typical detection pupil for the apparatus illustrated in FIG. 7, and (b) the same detection pupil for which the illumination NA has been increased.
Figure 9:
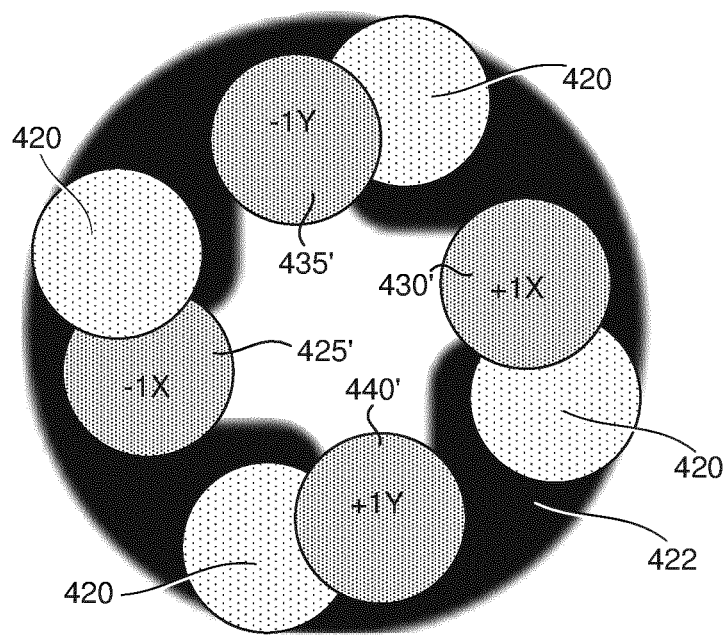

The zeroth order (specularly reflected) radiation is blocked at a suitable location in the detection branch; e.g., by the spot mirror 340 and/or a separate detection zero-order block element. It should be noted that there is a zeroth order reflection for each of the off-axis illumination beams, i.e. in the current embodiment there are four of these zeroth order reflections in total. An example aperture profile suitable for blocking the four zeroth order reflections is shown in FIGS. 9(a) and (b), labelled 422. As such, the metrology device operated as a dark field metrology device.

A main concept of this metrology device is to induce spatial coherence in the measurement illumination only where required. More specifically, spatial coherence is induced between corresponding sets of pupil points in each of the off-axis beams 330. More specifically, a set of pupil points comprises a corresponding single pupil point in each of the off-axis beams, the set of pupil points being mutually spatially coherent, but where each pupil point is incoherent with respect to all other pupil points in the same beam. By optimizing the coherence of the measurement illumination in this manner, it becomes feasible to perform dark field off-axis illumination on small pitch targets, but with minimal speckle artifacts as each off-axis beam 330 is spatially incoherent.

Figure 8:
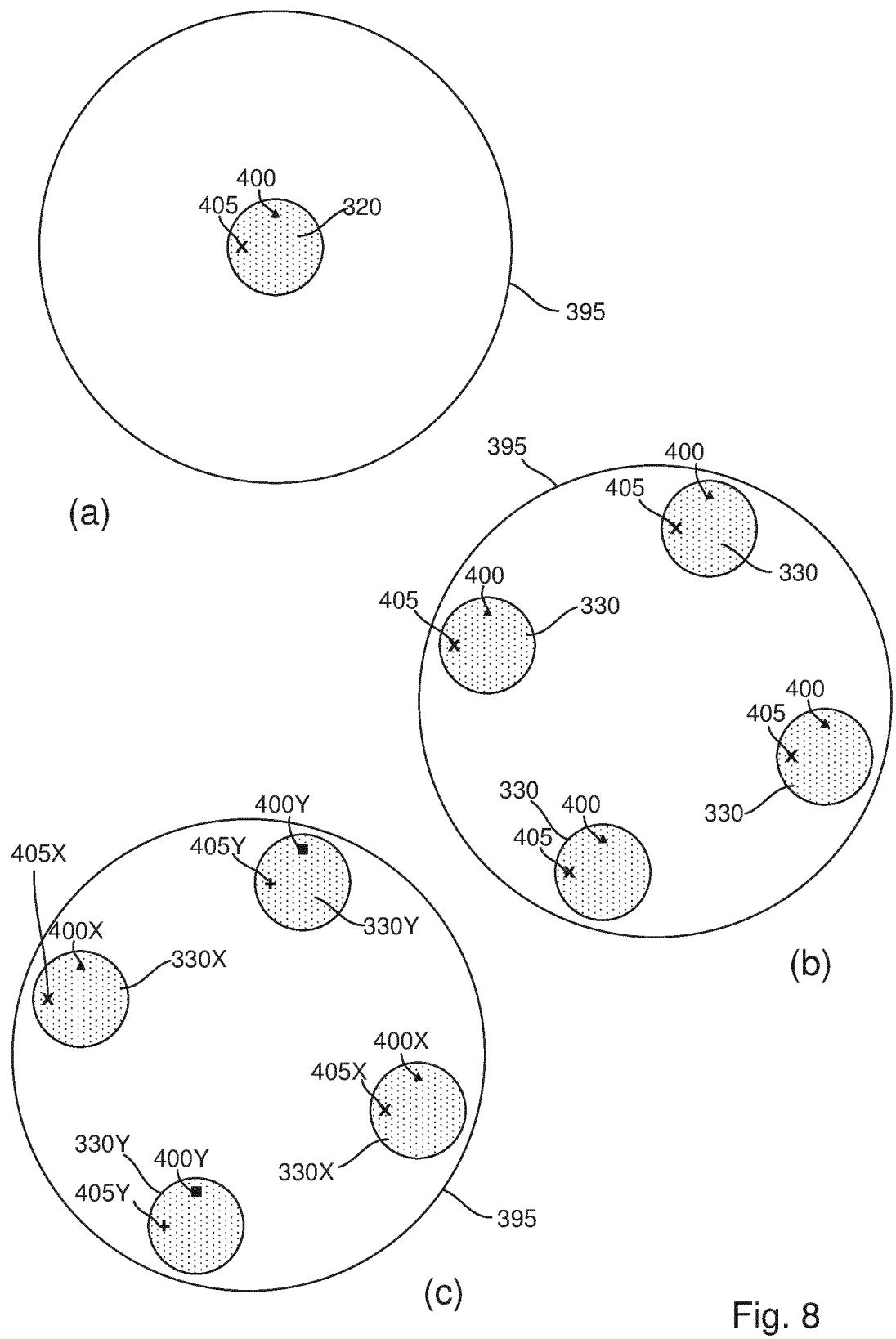
FIG. 8 comprises (a) a pupil image of input radiation (b) pupil image of off-axis illumination beams illustrating an operational principle of the metrology device of FIG. 7 according to a first embodiment; and (c) pupil image of off-axis illumination beams illustrating an operational principle of the metrology device of FIG. 7 according to a second embodiment.

FIG. 8 shows three pupil images to illustrate the concept. FIG. 8(a) shows a first pupil image which relates to pupil plane P1 in FIG. 7, and FIGS. 8(b) and 8(c) each show a second pupil image which relates to pupil plane P2 and pupil plane P3 respectively in FIG. 7. FIG. 8(a) shows (in cross-section) the spatially incoherent radiation beam 320, and FIGS. 8(b) and 8(c) show (in cross-section) the off-axis beams 330 generated by coherent off-axis illumination generator 325 in two different embodiments. In each case, the extent of the outer circle 395 corresponds to the maximum detection NA of the microscope objective; this may be, purely by way of an example 0.95 NA.

The triangles 400 in each of the pupils indicate a set of pupil points that are spatially coherent with respect to each other. Similarly, the crosses 405 indicate another set of pupil points which are spatially coherent with respect to each other. The triangles are spatially incoherent with respect to crosses and all other pupil points corresponding to beam propagation. The general principle (in the example shown in FIG. 8(b)) is that each set of pupil points which are mutually spatially coherent (each coherent set of points) have identical spacings within the illumination pupil P2 as all other coherent sets of points. As such, in this embodiment, each coherent sets of points is a translation within the pupil of all other coherent sets of points.

In FIG. 8(b), the spacing between each pupil point of the first coherent set of points represented by triangles 400 must be equal to the spacing between each pupil point of the coherent set of points represented by crosses 405. 'Spacing' in this context is directional, i.e., the set of crosses (second set of points) is not allowed to be rotated with respect to the set of triangles (first set of points). As such, each of the off-axis beams 330 comprises by itself incoherent radiation; however the off-axis beams 330 together comprise identical beams having corresponding sets of points within their cross-section that have a known phase relationship (spatial coherence). It should be noted that it is not necessary for the points of each set of points to be equally spaced (e.g., the spacing between the four triangles 405 in this example is not required to be equal). As such, the off-axis beams 330 do not have to be arranged symmetrically within the pupil.

FIG. 8(c) shows that this basic concept can be extended to providing for a mutual spatial coherence between only the beams corresponding to a single measurement direction where beams 330X correspond to a first direction (X-direction) and beams 330Y correspond to a second direction (Y-direction). In this example, the squares and plus signs each indicate a set of pupil points which correspond to, but are not necessarily spatially coherent with, the sets of pupil points represented by the triangles and crosses. However, the crosses are mutually spatially coherent, as are the plus signs, and the crosses are a geometric translation in the pupil of the plus signs. As such, in FIG. 8(c), the off-axis beams are only pair-wise coherent.

In this embodiment, the off-axis beams are considered separately by direction, e.g., X direction 330X and Y direction 330Y. The pair of beams 330X which generate the captured X direction diffraction orders need only be coherent with one another (such that pair of points 400X are mutually coherent, as are pair of points 405X). Similarly the pair of beams 330Y which generate the captured Y direction diffraction orders need only be coherent with one another (such that pair of points 400Y are mutually coherent, as are pair of points 405Y). However, there does not need to be coherence between the pairs of points 400X and 400Y, nor between the pairs of points 405X and 405Y. As such there are pairs of coherent points comprised in the pairs of off-axis beams corresponding to each considered measurement direction. As before, for each pair of beams corresponding to a measurement direction, each pair of coherent points is a geometric translation within the pupil of all the other coherent pairs of points.

FIG. 9(a) shows a detection pupil representation (captured orders only) resultant from all four off-axis illumination beams 420. The captured orders include the −1 X direction diffraction order 425, a +1 X direction diffraction order 430, a −1 Y direction diffraction order 435 and a +1 Y direction diffraction order 440. These diffraction orders are imaged on the camera where they interfere forming a fringe pattern, as described. It can be seen that, because of the need to capture four (or in some single direction embodiments, two) beams 425, 430, 435, 435 and simultaneously block four zeroth orders 420 (done here by zeroth order block 422), the maximum illumination and detection NA is limited, in this case to approximately 0.2. FIG. 9(b) shows what might be expected if the illumination NA was increased. In this case the illumination and detection regions would overlap and dark field metrology would be impossible.

Figure 10:
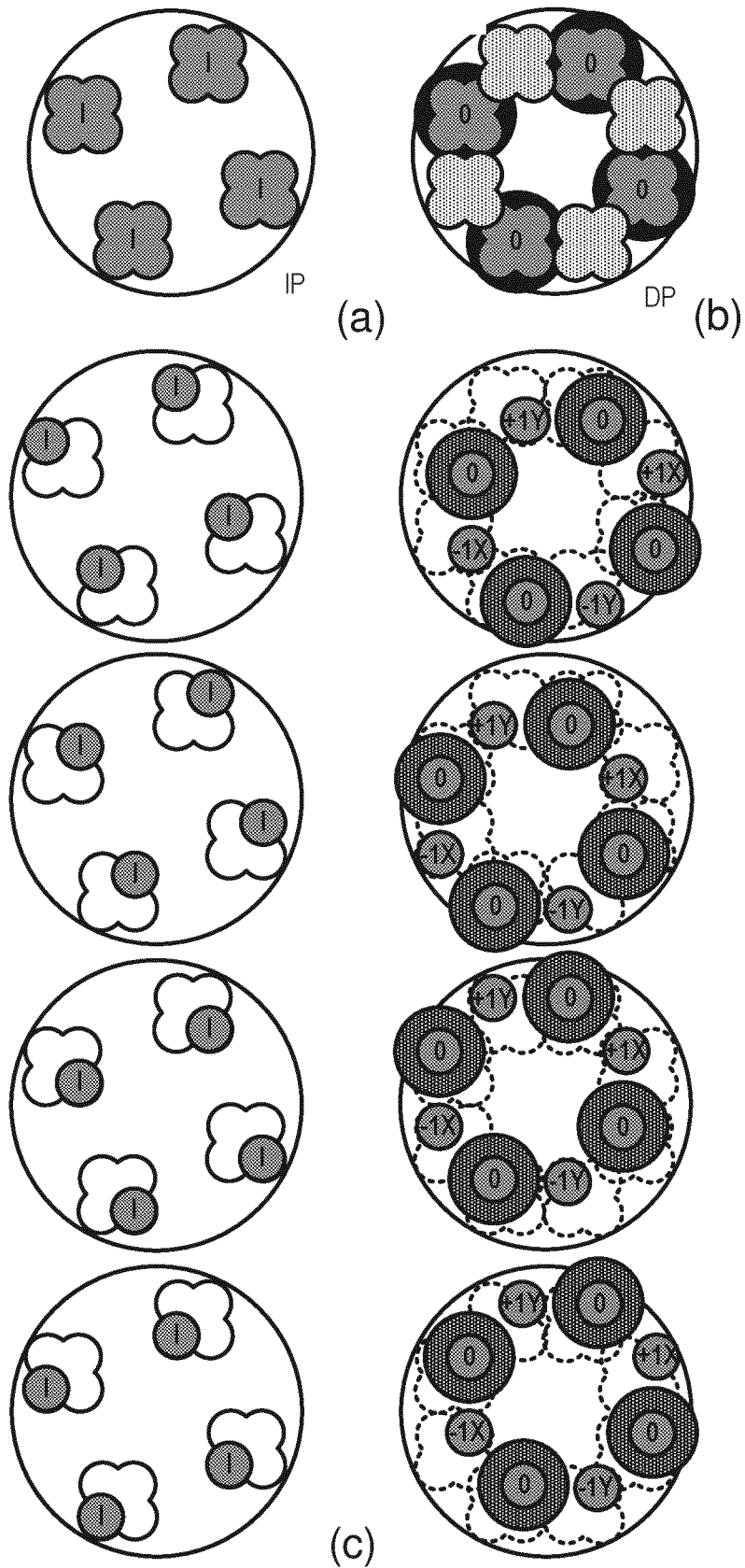
FIG. 10 is (a) an illumination pupil representation and (b) a detection pupil representation, and (c) scan components of (a) and (b), illustrating the inventive concept with respect to the metrology device of FIG. 7.

FIG. 10 illustrates how the concepts described herein can be used to significantly increase this illumination and detection NA by about 50% (e.g. about 0.3). This essentially doubles the number of spatial modes available, enabling further averaging of speckles. The concept is the same, other than it is all four off-axis illumination beams which are scanned over a larger illumination pupil area I within the illumination pupil IP. This is illustrated in FIG. 10(*a*). The resultant detection pupil is illustrated in FIG. 10(*b*), which shows a larger zeroth order stop margin and detection NA, with respect to the arrangement of FIG. 9(*a*).

FIG. 10(*c*) shows how the pupils illustrated in FIGS. 10(*a*) and 10(*b*) are made of four different scan locations (for the illumination and correspondingly for the zeroth order stop) (e.g., summed together). In this respect, the apparatus is operating in a manner described by embodiment 2) above; as the beams are essentially spatially incoherent. While shown as apertures, the zeroth order stop may take a form similar as zeroth order stop 422 in FIG. 9. As an alternative, the apparatus may be operated in a two stage scanning embodiment (described as embodiment 3) above). For example, the first scan may scan M locations with a disk of, for example, between 0.1 NA and 0.15 NA in the pupil, while the zeroth order block is at a fixed position, e.g., to cover the area of one of the four locations illustrated at FIG. 10(*b*). A disk of 0.15 NA, for example, has an advantage that 2×2 of 0.15 NA disks summed together covers approximately 0.3 NA per disk, a scan may comprise M=3×3=9 positions. The second scan is performed simultaneously with the zeroth order block over the remaining three locations illustrated at FIG. 10(*b*).

Figure 11:
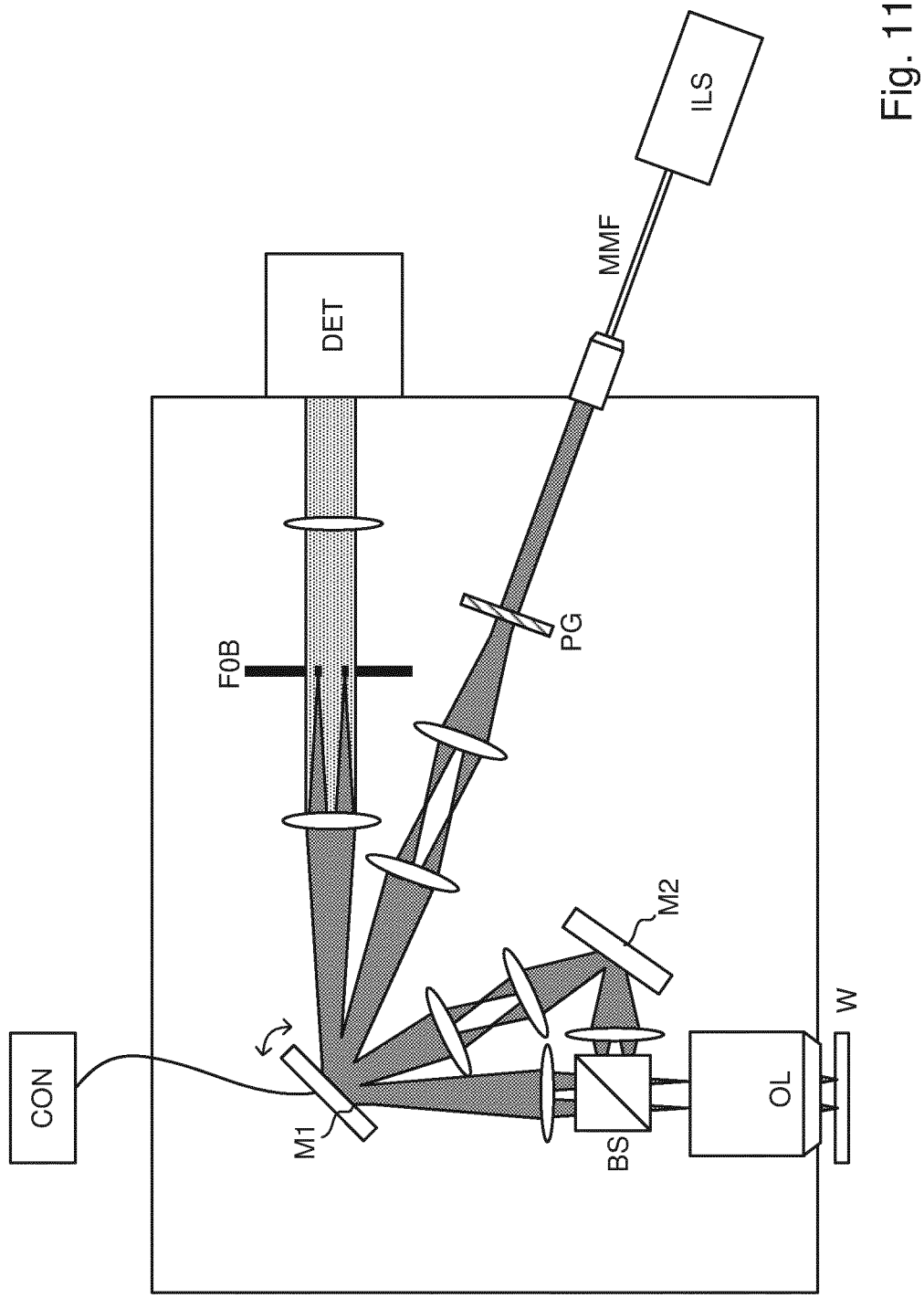
FIG. 11 is a schematic illustration of a metrology device according to a third embodiment of the invention.

FIG. 11 shows a simplified representation of a combination of the apparatuses illustrated in FIG. 5/6 and FIG. 7. More specifically, the arrangement is based on that illustrated in FIG. 6 (although an arrangement based on that of FIG. 5 could be envisaged), but with the addition of an off-axis illumination generator (e.g., a phase grating) PG and the remaining optics adapted accordingly. The remaining arrangement is essentially the same as shown in FIG. 6, so will not be described further.

Figure 12:
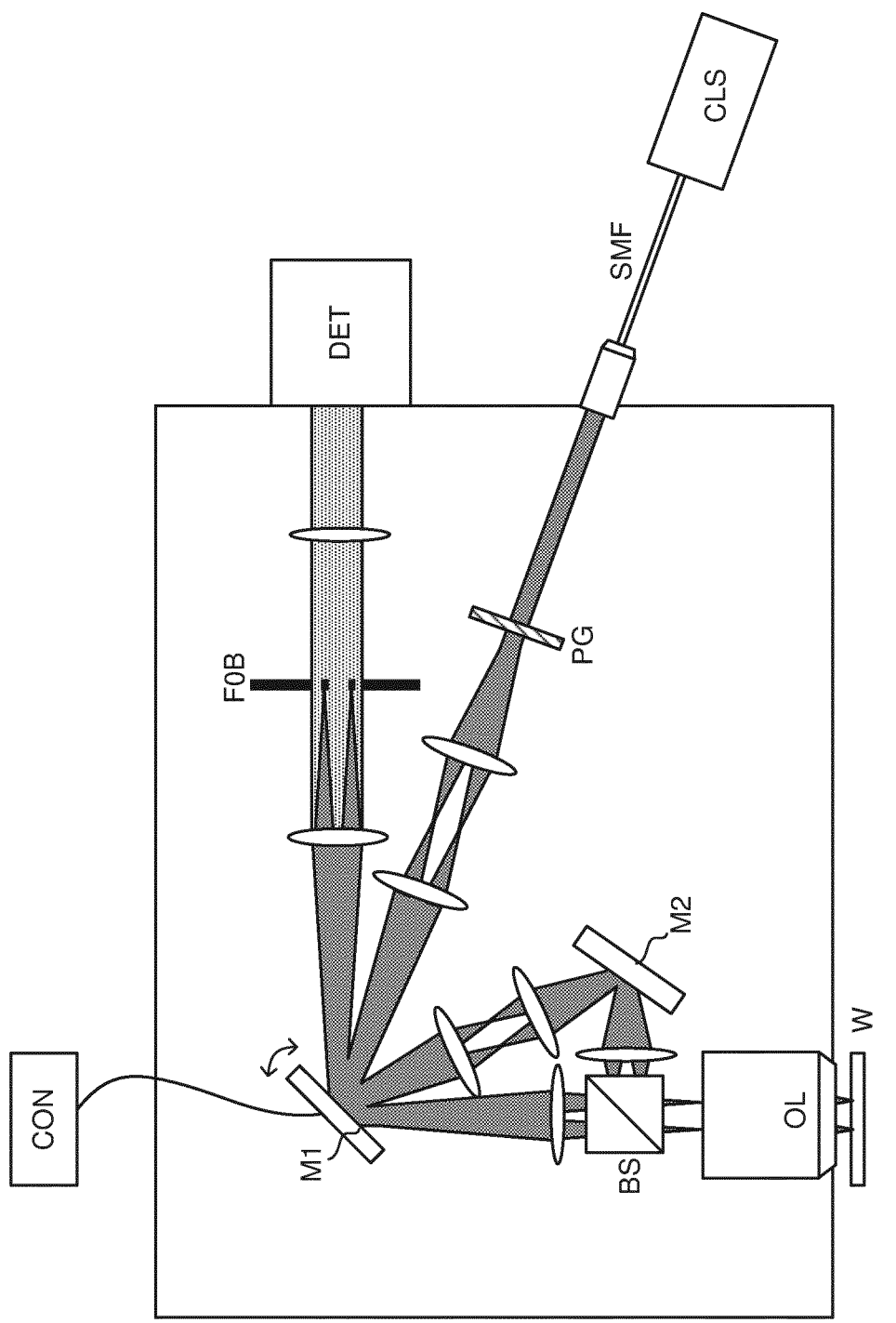
FIG. 12 is a schematic illustration of a metrology device according to a fourth embodiment of the invention.

FIG. 12 shows a variation of the arrangement of FIG. 11. In FIG. 11, The light source ILS is a spatially incoherent light source which is transported via a multimode fiber MMF. In the embodiment of FIG. 12, a coherent radiation source CLS is used, with the radiation transported via a single mode fiber SMF. While the advantage of the metrology device in this embodiment is that the radiation is mostly incoherent, the effect of integrating/averaging over a number of scanned positions within the pupil mimics the effect of incoherent radiation (averages out the speckles) and as such, a coherent radiation source can be used, particularly when the scanning is over a larger number of positions.

The term dark field metrology apparatus as used herein can refer to any dark field microscope or other metrology device regardless of intended application. Zeroth order radiation comprises specularly reflected or transmitted radiation, depending on the metrology apparatus setup (e.g., whether measurements are performed reflectively or transmissively). Higher order diffracted radiation can comprise radiation from any one or more diffracted orders (e.g., not only or necessarily first orders).

Embodiments are provided according to the following clauses:

1. A dark field metrology device comprising:
    an objective lens arrangement operable to direct illumination onto a specimen to be measured and to collect scattered radiation from said specimen, said scattered radiation comprising zeroth order radiation and higher order diffracted radiation, wherein said objective lens arrangement defines a maximum range of illumination angles for accepting said illumination in an illumination path and a maximum range of detection angles for accepting the scattered radiation in a detection path; and
    a zeroth order block operable to block said zeroth order radiation;
    wherein said dark field metrology device is operable to perform an illumination scan to scan said illumination over at least two different subsets of said maximum range of illumination angles; and simultaneously perform a detection scan which scans one of both of the zeroth order block and the scattered radiation with respect to each other over a corresponding subset of said maximum range of detection angles during at least part of said illumination scan.
2. A dark field metrology device as in clause 1, wherein said detection scan is performed simultaneously in synchronicity with at least part of said illumination scan, to ensure the zeroth order is always blocked during the illumination scan.
3. A dark field metrology device as in clause 1 or 2, wherein said detection scan comprises moving the zeroth order block.
4. A dark field metrology device as in clause 1 or 2, wherein said detection scan comprises scanning the scattered radiation over the zeroth order block, with said zeroth order block being fixed.
5. A dark field metrology device as in clause 4, wherein said illumination scan and detection scan is performed simultaneously by a common optical element to ensure synchronization.
6. A dark field metrology device as in any preceding clause, wherein the illumination scan is performed at a plurality of different subsets of said maximum range of illumination angles, the number of which being dependent on the coherence of the illumination.
7. A dark field metrology device as in clause 6, wherein the illumination is spatially incoherent, having M spatial modes, and said illumination scan is performed for K different subsets of said maximum range of illumination angles such that M*K is approximately equal to the total number of spatial modes available and/or to be addressed at specimen level.
8. A dark field metrology device as in clause 6, wherein the illumination is illumination is spatially coherent and said illumination scan and detection scan are performed in two-stages, a first stage comprises performing the illumination scan over a first plurality of subsets of said maximum range of illumination angles while the zeroth order block being fixed relative to the scattered radiation and a second stage where the illumination scan and detection scan are performed simultaneously over a second plurality of subsets of said maximum range of illumination angles.
9. A dark field metrology device as in any of clauses 1 to 8, wherein said illumination comprises a plurality of illumination beams, and comprising multiple pupil points in an illumination pupil of the metrology device, wherein for the illumination beams corresponding to at least each considered measurement direction, each pupil point in each one of said plurality of illumination beams has a corresponding pupil point in the other illumination beams of said plurality of illumination beams thereby defining multiple sets of corresponding pupil points, and wherein the pupil points of each set of corresponding pupil points are spatially coherent with respect to each other.

10. A dark field metrology device as in clause 9, wherein an illumination source which sources said illumination is coherent and said illumination scan ensures that the illumination is otherwise incoherent other than for said multiple sets of corresponding pupil points.

11. A dark field metrology device as in clause 9 or 10, wherein each pupil point is substantially spatially incoherent with respect to all other pupil points in the same illumination beam.

12. A dark field metrology device as in any of clauses 9 to 11, wherein each illumination beam is located in the illumination pupil, such that a corresponding higher diffraction order is captured in a detection pupil of the metrology device for each illumination beam, following scattering of said measurement illumination by a periodic structure.

13. A dark field metrology device as in clause 12, wherein said plurality of illumination beams comprises a pair of illumination beams per considered measurement direction, and the corresponding higher diffraction orders captured comprise complementary higher diffraction orders for each direction.

14. A dark field metrology device as in any preceding clause, comprising a fiber bundle for selectively transporting the illumination towards the objective lens arrangement, and operable such that said illumination scan is effected by sequential selection of different subsets of fibers comprised within the fiber bundle to perform said transporting.

15. A dark field metrology device as in any preceding clause, being operable to perform metrology as part of an integrated circuit manufacturing control process.

16. A dark field metrology device as in clause 15, wherein said metrology comprises pre-exposure metrology to perform alignment of a substrate stage and/or reticle stage.

17. A dark field metrology device as in clause 15, wherein said metrology comprises post-exposure metrology to measure a performance parameter.

18. A dark field metrology device as in clause 16, where said performance parameter comprises one or more of overlay, focus, dose, critical dimension or edge placement error.

19. A dark field metrology device as in any preceding clause, wherein said specimen comprises a metrology target.

The terms "radiation" and "beam" used in relation to the metrology devices described herein encompass all types of electromagnetic radiation, in any wavelength range, including infrared wavelengths such as 1000-3000 nm wavelengths.

While the above description describes corrections for a lithographic apparatus/scanner, the determined corrections may also be used for any process and by any integrated circuit (IC) manufacturing apparatus in an IC manufacturing process, e.g., an etch apparatus, which has an effect on the position and/or a dimension of the structures formed within a layer.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A dark field metrology device comprising:
   an objective lens arrangement configured to direct illumination onto a specimen to be measured and to collect scattered radiation from the specimen, the scattered radiation comprising zeroth order radiation and higher order diffracted radiation, wherein the objective lens arrangement defines a maximum range of illumination angles for accepting the illumination in an illumination path and a maximum range of detection angles for accepting the scattered radiation in a detection path; and
   a zeroth order block configured to block the zeroth order radiation,
   wherein the dark field metrology device is configured to perform an illumination scan to scan the illumination over at least two different subsets of the maximum range of illumination angles; and simultaneously perform a detection scan which scans the zeroth order block and/or the scattered radiation with respect to each other over a corresponding subset of the maximum range of detection angles during at least part of the illumination scan.

2. The device as claimed in claim 1, wherein the detection scan is performed simultaneously in synchronicity with at least part of the illumination scan, to ensure the zeroth order is always blocked during the illumination scan.

3. The device as claimed in claim 1, wherein the detection scan comprises moving the zeroth order block.

4. The device as claimed in claim 1, wherein the detection scan comprises scanning the scattered radiation over the zeroth order block, with the zeroth order block being fixed.

5. The device as claimed in claim 4, wherein the illumination scan and detection scan is performed simultaneously by a common optical element to ensure synchronization.

6. The device as claimed in claim 1, wherein the illumination scan is performed at a plurality of different subsets of the maximum range of illumination angles, the number of which being dependent on coherence of the illumination.

7. The device as claimed in claim 6, wherein the illumination is spatially incoherent, having M spatial modes, and the illumination scan is performed for K different subsets of the maximum range of illumination angles such that M*K is approximately equal to the total number of spatial modes available and/or to be addressed at specimen level.

8. The device as claimed in claim 6, wherein the illumination is spatially coherent and the illumination scan and detection scan are performed in two stages, a first stage comprises performing the illumination scan over a first plurality of subsets of the maximum range of illumination angles while the zeroth order block is fixed relative to the scattered radiation and a second stage where the illumination scan and detection scan are performed simultaneously over a second plurality of subsets of the maximum range of illumination angles.

9. The device as claimed in claim 1, wherein the illumination comprises a plurality of illumination beams, and comprising multiple pupil points in an illumination pupil of the metrology device, wherein for the illumination beams corresponding to at least each considered measurement direction, each pupil point in each one of the plurality of illumination beams has a corresponding pupil point in the other illumination beams of the plurality of illumination beams thereby defining multiple sets of corresponding pupil points, and wherein the pupil points of each set of corresponding pupil points are spatially coherent with respect to each other.

10. The device as claimed in claim 9, wherein an illumination source which sources said illumination is coherent and the illumination scan ensures that the illumination is otherwise incoherent other than for the multiple sets of corresponding pupil points.

11. The device as claimed in claim 9, wherein each pupil point is substantially spatially incoherent with respect to all other pupil points in the same illumination beam.

12. The device as claimed in claim 9, wherein each illumination beam is located in the illumination pupil, such that a corresponding higher diffraction order is captured in a detection pupil of the metrology device for each illumination beam, following scattering of the measurement illumination by a periodic structure.

13. The device as claimed in claim 12, wherein the plurality of illumination beams comprises a pair of illumination beams per considered measurement direction, and the corresponding higher diffraction orders captured comprise complementary higher diffraction orders for each direction.

14. The device as claimed in claim 1, comprising a fiber bundle configured to selectively transport the illumination towards the objective lens arrangement, and configured such that the illumination scan is effected by sequential selection of different subsets of fibers comprised within the fiber bundle to perform the transportation of the illumination.

15. The device as claimed in claim 1, configured to perform metrology as part of an integrated circuit manufacturing control process.

16. The device as claimed in claim 15, wherein the metrology comprises pre-exposure metrology to perform alignment of a substrate stage and/or reticle stage.

17. The device as claimed in claim 15, wherein the metrology comprises post-exposure metrology to measure a performance parameter.

18. The device as claimed in claim 16, where the performance parameter comprises one or more selected from: overlay, focus, dose, critical dimension or edge placement error.

19. The device as claimed in claim 1, wherein the specimen comprises a metrology target.

20. A method comprising:
by an objective lens arrangement, directing illumination onto a specimen to be measured and collecting scattered radiation from the specimen, the scattered radiation comprising zeroth order radiation and higher order diffracted radiation, wherein the objective lens arrangement defines a maximum range of illumination angles for accepting the illumination in an illumination path and a maximum range of detection angles for accepting the scattered radiation in a detection path; and
blocking the zeroth order radiation using a zeroth order block,
wherein the directing comprising performing an illumination scan to scan the illumination over at least two different subsets of the maximum range of illumination angles, and simultaneously with the illumination scan, the collecting comprises performing a detection scan which scans the zeroth order block and/or the scattered radiation with respect to each other over a corresponding subset of the maximum range of detection angles during at least part of the illumination scan.

\* \* \* \* \*